United States Patent [19]

Yoneyama et al.

[11] Patent Number: 5,719,626
[45] Date of Patent: Feb. 17, 1998

[54] SOLID-STATE IMAGE PICKUP DEVICE

[75] Inventors: Toshikazu Yoneyama, Saitama-ken; Tadao Isogai, Kanagawa-ken, both of Japan

[73] Assignee: Nikon Corporation, Tokyo, Japan

[21] Appl. No.: 572,796

[22] Filed: Dec. 15, 1995

[30] Foreign Application Priority Data

| Dec. 16, 1994 | [JP] | Japan | 6-334224 |
| Feb. 24, 1995 | [JP] | Japan | 7-060034 |
| Aug. 7, 1995 | [JP] | Japan | 7-221048 |

[51] Int. Cl.$^6$ ............................ H04N 5/335
[52] U.S. Cl. ................ 348/301; 377/80; 377/81
[58] Field of Search ........................ 348/294, 300, 348/301, 302, 307, 308; 377/77, 78, 79, 80, 81; H04N 5/335

[56] References Cited

U.S. PATENT DOCUMENTS

| 4,057,741 | 11/1977 | Piguet | 377/81 |
| 4,809,075 | 2/1989 | Akimoto et al. | 348/301 |
| 4,942,474 | 7/1990 | Akimoto et al. | . |
| 4,975,932 | 12/1990 | Matsushima et al. | 377/81 |
| 5,172,249 | 12/1992 | Hashimoto | . |

FOREIGN PATENT DOCUMENTS 4-109776  4/1992  Japan .

OTHER PUBLICATIONS

Mikio Kyomasu, "A new MOS Using Photodiode as Current Source"; IEEE Journal of Solid-State Circuits, vol. 26, No. 8, pp. 1116-1122.

Primary Examiner—Andrew Faile
Assistant Examiner—Tuan V. Ho
Attorney, Agent, or Firm—Foley & Lardner

[57] ABSTRACT

A solid-state image pickup device includes a plurality of pixels each having a light-receiving element and an amplification element, and a scanning circuit having a shift register constituted by connecting a plurality of circuit stages in tandem and capable of almost simultaneously setting outputs from the plurality of circuit stages in a predetermined logical state upon reception of a predetermined control signal. In the solid-state image pickup device, the outputs from the plurality of circuit stages are set in the predetermined logical state to select the plurality of pixels, and the charges in the light-receiving elements are reset while cutting off the amplification elements of the plurality of pixels selected. With this arrangement, an inrush current upon reset can be decreased.

7 Claims, 5 Drawing Sheets

SOLID-STATE IMAGE PICKUP DEVICE

BACKGROUND OF THE INVENTION

1. Field of the Invention

The present invention relates to a solid-state image pickup device and, more particularly, to a solid-state image pickup device which is used for an electronic still camera or the like and can instantaneously reset all pixels and largely reduce an inrush current which flows upon reset.

2. Related Background Art

Solid-state image pickup elements used in solid-state image pickup devices are roughly classified into CCD solid-state image pickup elements and amplification image pickup elements. The unit pixel of a CCD image pickup element is formed of a buried photodiode serving as a photoelectric conversion portion for converting incident light to a signal charge and a transfer portion for transferring the signal charge and reading out the signal charge.

On the other hand, the unit pixel of an amplification solid-state image pickup element is constituted by a transistor such as a MOS static induction transistor (to be referred to as a MOS.SIT hereinafter), a junction field effect transistor (to be referred to as a J.FET hereinafter), and a bipolar transistor. The photoelectric conversion portion is formed of a MOS diode or a p-n junction diode as one of constituent elements of a transistor. The amplification solid-state image pickup element is preferred because of its advantage of, e.g., a high output signal level. However, fixed pattern noise poses a problem. The sensor noise is decreased by, e.g., inserting a switching means between a charge accumulation means and an amplification means, as described in U.S. Pat. No. 5,172,249.

In a solid-state image pickup device, e.g., in an electronic still camera, all pixels are instantaneously reset upon pressing the shutter, and thereafter, the object image is picked up. As described in, e.g., U.S. Pat. No. 4,942,474, a plurality of light-receiving means are simultaneously reset at once to start a photoelectric signal accumulation operation, and after amplified outputs of photoelectric signals from these light-receiving means are input to a plurality of capacitors at once, these capacitors are scanned to obtain a scanning output.

In a solid-state image pickup device, an inversion layer is formed below the gate electrode of a static induction transistor (SIT). A channel is formed between the source and drain of the SIT, a residual charge accumulated in the gate flows out, and all pixels are reset. More specifically, in a solid-state image pickup device having an amplification solid-state image pickup element, the pixel portion including the amplification means as a whole is reset by simultaneously selecting all pixels. For this reason, all amplification means in the pixels are simultaneously turned on upon reset, and currents simultaneously flow through all amplification means. This current is called an inrush current. A large inrush current flows through the entire image pickup device because all pixels are simultaneously turned on, though the inrush current in each pixel is small.

For example, with 1,000,000 pixels, an inrush current of several A flows through the entire device although the inrush current in each pixel is as small as several μA. When a current of several A flows in the chip of the solid-state image pickup device, the reliability undesirably degrades due to electro-migration. In addition, the voltage of each portion in the chip cannot fall within a predetermined voltage range because of the parasitic impedance of each portion in the chip, resulting in a degradation in expected performance of the chip in the solid-state image pickup device. Furthermore, an erroneous operation may be caused due to the inrush current.

SUMMARY OF THE INVENTION

The present invention has been made to solve the problems of the above-described related art, and has as its object to provide a solid-state image pickup device using an amplification solid-state image pickup element, which can prevent an excess inrush current in reset to obtain a predetermined performance of the entire chip in the solid-state image pickup device, and also properly prevent a degradation in reliability of the solid-state image pickup device.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
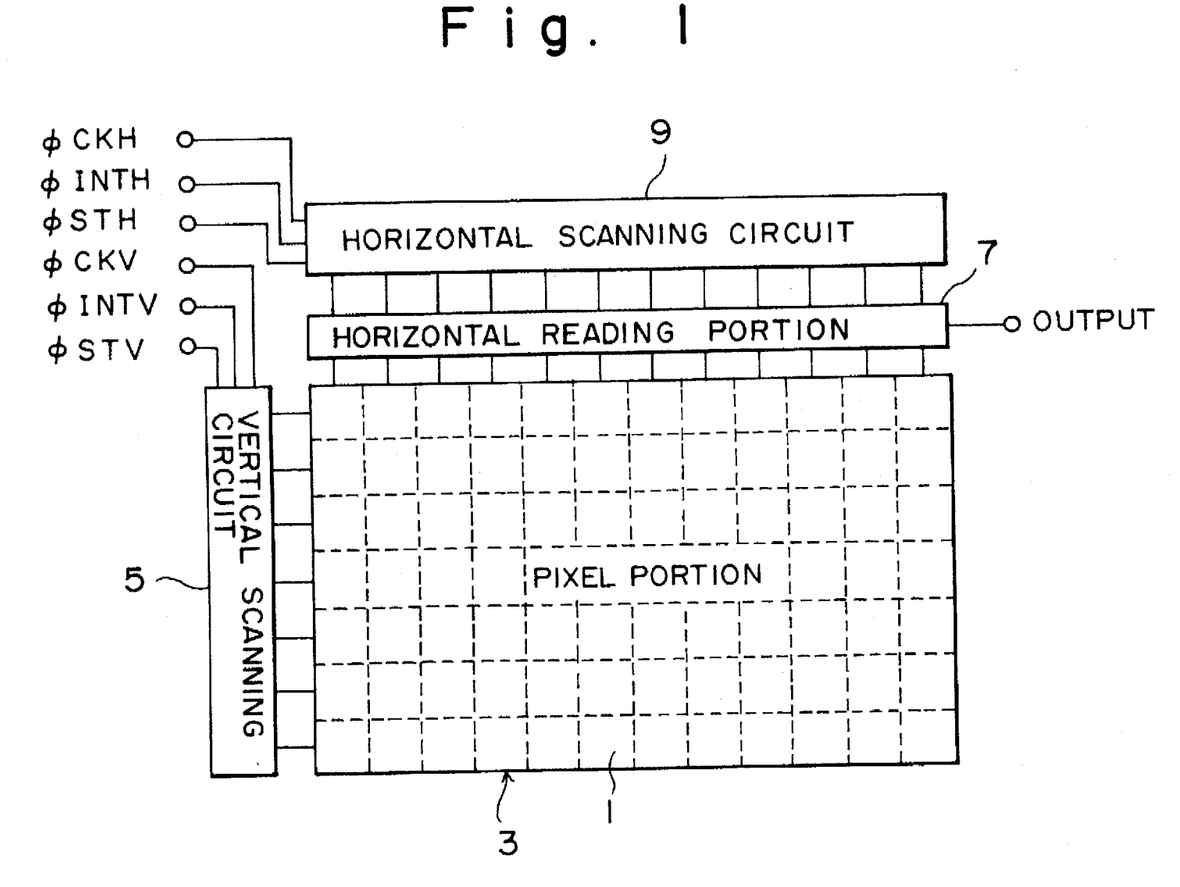
FIG. 1 is a block diagram schematically showing the arrangement of a solid-state image pickup element according to the present invention.

FIG. 1 is a block diagram schematically showing the arrangement of a solid-state image pickup device according to the present invention, in which a two-dimensional image sensor is shown. The same reference numerals denote the same or corresponding parts throughout the drawings. The solid-state image pickup device in FIG. 1 comprises a pixel portion 3 having a plurality of pixels 1, a vertical scanning circuit 5, a horizontal read portion 7, and a horizontal scanning circuit 9.

The pixel portion 3 has a structure in which the pixels 1 each having a light-receiving photodiode and an amplification element are arranged in a matrix, as will be described later. The vertical scanning circuit 5 sequentially selects pixels corresponding to one horizontal line (row line) of the pixel portion 3 and consists of a dynamic shift register having a structure to be described later. The horizontal read portion 7 receives charges of pixels corresponding to one horizontal line from the pixel portion 3 and sequentially outputs the charges on the basis of a scanning pulse from the horizontal scanning circuit 9. The horizontal scanning circuit 9 consists of a dynamic shift register, as in the vertical scanning circuit 5.

A signal ΦSTV input to the vertical scanning circuit 5 is a vertical start pulse as initial input data to the dynamic shift register. A vertical clock pulse ΦCKV and a vertical initialization pulse ΦINTV for performing the shift operation of the dynamic shift register are input to the vertical scanning circuit 5.

A signal ΦSTH input to the horizontal scanning circuit 9 is a start signal for the dynamic shift register constituting the horizontal scanning circuit 9, and ΦCKH represents a clock signal for a horizontal shift operation. A horizontal initialization pulse ΦINTH for initializing the dynamic shift register constituting the horizontal scanning circuit 9 is input to this scanning circuit 9 as needed.

When the solid-state image pickup device in FIG. 1 is used for, e.g., a still video camera, the solid-state image pickup device performs a pseudo operation before the shutter is pressed, i.e., no output signal is used although scanning is performed. When the shutter is pressed, the initialization pulse ΦINTV is applied to the vertical scanning circuit 5 for a predetermined period of about 10 μs, and simultaneously, the start pulse ΦSTV is set at H level. With this operation, all stages of the shift register of the vertical scanning circuit 5 subjected to the pseudo operation are forcibly set in a preset state to set all pixels in a selective state, and charges in all pixels can be reset.

Subsequently, the vertical start pulse ΦSTV is set at L level to reset the vertical scanning circuit 5. In addition, the initialization pulse ΦINTH is supplied to the horizontal scanning circuit 9, and the horizontal start pulse ΦSTH is set at L level to set the horizontal scanning circuit 9 in a reset state. Thereafter, the normal operation is restored to start the shift operation of each shift register. At this time, each pixel starts to accumulate image information. After the elapse of a predetermined exposure time, the initialization pulses ΦINTV and ΦINTH are set at H level, and the vertical start pulse ΦSTV and the horizontal start pulse ΦSTH are set at L level again to forcibly reset each shift register. Thereafter, the normal operation is restored to start a read operation. With this operation, a video signal exposed for a predetermined time can be obtained.

In the normal read operation of the solid-state image pickup device in FIG. 1, the initialization pulses ΦINTV and ΦINTH of the vertical scanning circuit 5 and the horizontal scanning circuit 9 are set at low level. In this state, a start signal ΦSTV of, e.g., high level is sequentially shifted in the vertical scanning circuit 5 in accordance with the clock signal ΦCKV, thereby sequentially selecting pixels corresponding to one horizontal line of the pixel portion 3. Charges accumulated in the photodiodes of the selected pixels corresponding to one horizontal line are transferred to the horizontal read portion 7. Subsequently, a start signal ΦSTH of, e.g., high level is added to the horizontal scanning circuit 9 thereby sequentially shifting the start signal ΦSTH in accordance with the clock signal ΦCKH. By this shift scanning, of charges transferred to the horizontal read portion 7, the charge in only one pixel is sequentially transferred in the horizontal direction and read out from an output terminal.

Figure 2:
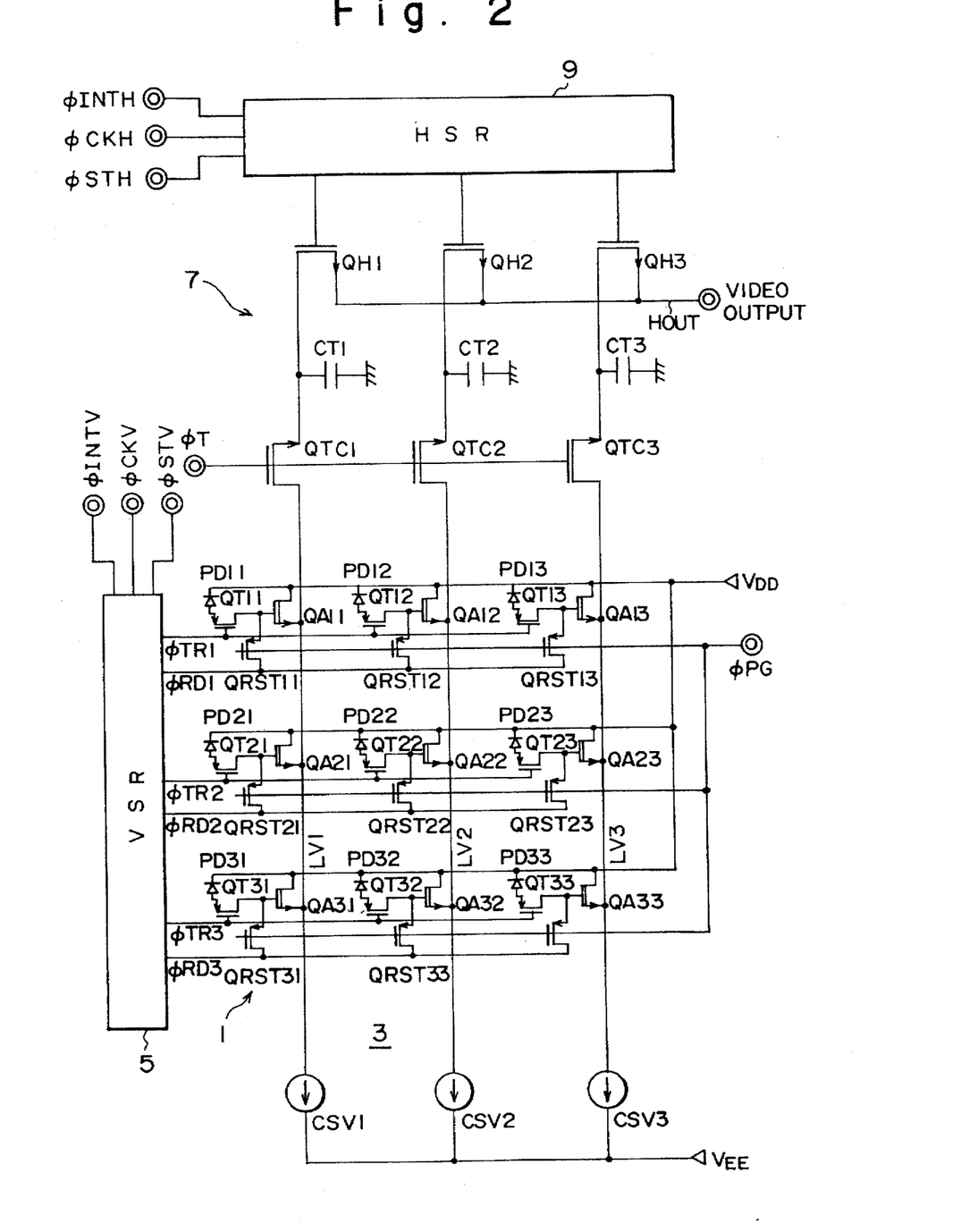
FIG. 2 is a circuit diagram of a solid-state image pickup device according to the first embodiment of the present invention.

FIG. 2 is a circuit diagram showing the detailed circuit arrangement of the solid-state image pickup device in FIG. 1. The same reference numerals as in FIG. 1 denote the same parts in FIG. 2. More specifically, the solid-state image pickup device in FIG. 2 also comprises the pixel portion 3 having the plurality of pixels 1, the vertical scanning circuit 5, the horizontal read portion 7, and the horizontal scanning circuit 9. In the circuit shown in FIG. 2, the pixel portion 3 comprises a 3×3 matrix of pixels 1 for the sake of descriptive convenience.

Each pixel 1 is constituted by a photodiode PD serving as a light-receiving element, an amplification element QA consisting of a junction field effect transistor (JFET), a transfer switch QT consisting of a MOS transistor for transferring a charge in the photodiode PD to the gate of the amplification element QA, and a reset switch QRST consisting of a MOS transistor for setting the gate electrode of the amplification element QA at a predetermined voltage. In FIG. 2, each element has a suffix. However, when one of elements of the same type is described for the sake of descriptive convenience, the suffix may be omitted. In each pixel 1 shown in FIG. 2, the photodiode PD serving as a light-receiving means and the gate of the amplification element QA are separated from each other. An amplification image sensor in which the light-receiving portion and the amplification portion are separated from each other is described in, e.g., U.S. Pat. No. 4,809,075, and the contents of this patent are incorporated in the present invention.

Of the amplification elements QA of the pixels 1, the amplification elements QA of pixels arranged in the vertical direction have sources connected to corresponding constant current sources CSV through column lines LV (LV1 to LV3). The constant current source CSV is a load during the operation of the amplification element QA as a source follower. The other end of each constant current source CSV is commonly connected to a predetermined power supply VEE.

The cathodes of the photodiodes PD of the pixels 1 are commonly connected to a predetermined power supply VDD, and their anodes are connected to the sources of the corresponding transfer switches QT. The drain of each transfer switch QT is connected to the gate of the corresponding amplification element QA and the source of the corresponding reset switch QRST. The sources of the amplification elements QA are commonly connected to the corresponding column lines LV (LV1 to LV3) in units of columns. The gates of the transfer switches QT are commonly connected to the vertical scanning circuit 5 in units of rows to receive first vertical scanning signals ΦTR. Vertical scanning signals ΦTR1 to ΦTR3 of the respective rows are connected to the output terminals of the circuit stages of the vertical scanning circuit 5. The gates of the reset switches QRST of all pixels are commonly connected to a control signal ΦPG. The drains of the reset switches QRST are commonly connected to the vertical scanning circuit 5 in the horizontal direction, and second vertical scanning signals ΦRD are supplied in units of rows. The drains of the amplification elements QA are commonly connected to the power supply VDD line to which the anodes of the photodiodes PD are connected.

The output terminals of the circuit stages of the vertical scanning circuit 5 supply the first and second vertical scanning signals ΦTR and ΦRD of different voltage levels. For this reason, predetermined voltage shift circuits can also be connected to the output terminals of the circuit stages of the shift register.

The horizontal read portion 7 is constituted by read gate transistors QTC, capacitors CT, and horizontal read switch elements QH in units of columns. The upper end of each column line LV is connected to the drain of the corresponding read gate transistor QTC, and the source of the read gate transistor QTC is connected to the drain of the horizontal read switch element QH and the capacitor CT of the corresponding column. The other end of the capacitor CT is grounded. The gates of all the read gate transistors QTC are commonly connected to supply a transfer pulse ΦT. The gates of the horizontal read switch elements QH are connected to the output terminals of the circuit stages of the shift register of the horizontal scanning circuit 9 in units of columns. The sources of the horizontal read switch elements QH are commonly connected to a video output terminal through a horizontal output line HOUT.

In the solid-state image pickup device having the above arrangement, reset of pixels is performed in the following manner. The initialization pulse ΦINTV and the start pulse ΦSTV of the vertical scanning circuit 5 are set at high level to preset all circuit stages of the vertical scanning circuit 5, thereby setting all pixels in the selected state. With this operation, the first vertical scanning signals ΦTR (ΦTR1 to ΦTR3) of all circuit stages are simultaneously set at low level to turn on the transfer switches QT of all pixels. In addition, the reset control signal ΦPG commonly used for all pixels is supplied to turn on the reset switches QRST of all pixels.

The voltage of the second vertical scanning signals ΦRD (ΦRD1 to ΦRD3) is a voltage VGL for cutting off the JFET constituting the amplification element QA of each pixel.

With this arrangement, the residual charge accumulated in the photodiode PD of each pixel is dumped through the transfer element QT and the reset element QRST. The photodiode PD is completely depleted and reset. In this case, the gate voltage of the amplification element QA is the voltage VGL, as described above, and the amplification element QA is cut off, so no current flows through the amplification element QA. More specifically, the current flowing through the photodiode PD is not amplified by the amplification element QA, so no amplified current flows. Therefore, since only the residual charge accumulated in the photodiode PD is extracted, and no current amplified by the amplification element QA flows, no excess inrush current flows through the entire solid-state image pickup device.

When a signal is to be read out in the solid-state image pickup device shown in FIG. 2, the initialization pulse ΦINTV of the vertical scanning circuit 5 is set at low level, the start pulse ΦSTV is set at high level, and the clock signal ΦCKV is supplied to cause the vertical scanning circuit 5 to perform a shift operation. With this operation, the pixels are sequentially selected in units of rows, and signals accumulated in the selected pixels are output to the vertical read line LV. The read gate transistors QTC connected to the column lines are turned on by the transfer pulse ΦT to accumulate signal read charges in the capacitors CT of the corresponding columns. Similarly, the horizontal scanning circuit 9 is caused to perform a shift operation by setting the initialization pulse ΦINTH at low level and the start pulse ΦSTH at high level and supplying the clock signal ΦCKH. With this operation, the horizontal read switch elements QH of the columns are sequentially turned on, and read signals of the respective columns are supplied to the horizontal output line HOUT and output from the video output terminal.

When such signal reading is to be performed, the reset switches QRST of all pixels are turned on by the reset control signal ΦPG. For a selected row, the voltage of the second vertical scanning signal ΦRD is set at a voltage VGH for turning on the amplification element QA of each pixel and activating the pixel. For non-selected pixels, the voltage is set at the voltage VGL for cutting off the amplification elements QA. Even when the control signal ΦPG is turned off in this state, the gate voltage of the amplification element QA is held at the same value due to the gate stray capacitance of the amplification element QA. Therefore, after the reset elements QRST of all pixels are turned off by the reset control signal ΦPG, the transfer elements of the pixels of the selected row are turned on by the first vertical scanning signal ΦTR. With this operation, the signal charge accumulated in the photodiode PD is transferred to the gate of the amplification element QA, and the gate voltage of the amplification element QA changes in correspondence with the signal. This voltage is output to the column line LV by operating the amplification element QA as a source follower, and sequentially read out by scanning the horizontal scanning circuit 9, as described above.

Figure 3:
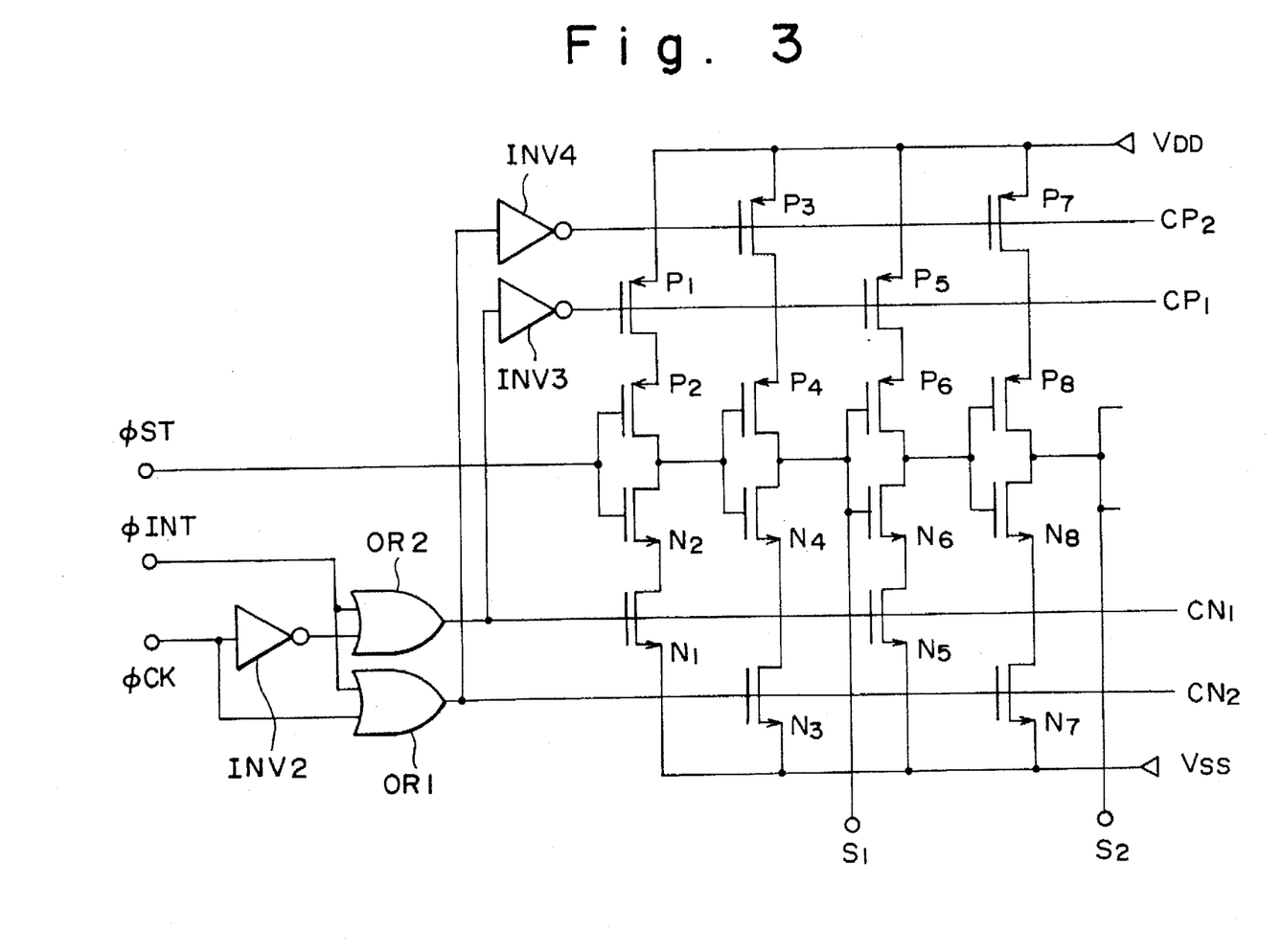
FIG. 3 is a circuit diagram showing the arrangement of a shift register used in the scanning circuit of the solid-state image pickup device according to the present invention.

FIG. 3 is a circuit diagram showing the arrangement of a dynamic shift register usable as the horizontal scanning circuit and the vertical scanning circuit of the solid-state image pickup device according to the present invention. The dynamic shift register in FIG. 3 uses so-called clocked inverters formed using a CMOS process and sequentially activated by a clock pulse.

In the dynamic shift register shown in FIG. 3, two PMOS transistors P1 and P2 and two NMOS transistors N2 and N1, which are series-connected between a positive power supply voltage $V_{DD}$ and a negative power supply voltage $V_{SS}$ constitute a first-stage clocked inverter. PMOS transistors P3 and P4 and NMOS transistors N4 and N3 constitute a second-stage clocked inverter, PMOS transistors P5 and P6 and NMOS transistors N6 and N5 constitute a third-stage clocked inverter, and PMOS transistors P7 and P8 and NMOS transistors N8 and N7 constitute a fourth-stage clocked inverter.

The PMOS and NMOS transistors at the center of each clocked inverter, i.e., the transistors P2 and N2 at the first stage, the transistors P4 and N4 at the second stage, the transistors P6 and N6 at the third stage, or the transistors P8 and N8 at the fourth stage constitute a CMOS inverter. The transistor connected between each CMOS transistor and the power supply $V_{DD}$ or $V_{SS}$ is a control transistor for activating the CMOS transistor.

Of these control transistors, the PMOS transistors P1, P5, . . . have gates connected to an internal clock signal line CP1. The PMOS transistors P3, P7, . . . have gates connected to an internal clock signal line CP2. The control transistor of the other conductivity type, i.e., the NMOS transistors N1, N5, . . . have gates connected to an internal clock signal line CN1, and the NMOS transistors N3, N7, . . . have gates connected to another internal clock signal line CN2.

The start pulse ΦST is supplied to the gates of the transistors P2 and N2 constituting the first-stage CMOS inverter. The output terminal of the first-stage CMOS inverter is connected to the input terminal of the second-stage CMOS inverter, i.e., the gates of the transistors P4 and N4. The output terminal of the second-stage CMOS inverter is connected to the input terminal of the third-stage CMOS inverter, and the output terminal of the third-stage CMOS inverter is sequentially connected to the input terminal of the fourth-stage CMOS inverter.

In the dynamic shift register shown in FIG. 3, for example, when the PMOS transistor P1 and the NMOS transistor N1 are in the ON state, the CMOS inverter constituted by the PMOS transistor P2 and the NMOS transistor N2 is in an operable state. This state is called an active state. To the contrary, when the PMOS transistor P1 and the NMOS transistor N1 are in the OFF state, the CMOS inverter constituted by the PMOS transistor P2 and the NMOS transistor N2 does not operate. This state is called an inactive state.

The dynamic shift register shown in FIG. 3 has an inverter INV2 and OR gates OR1 and OR2, all of which constitute a simultaneous activating circuit, and two inverters INV3 and INV4. An initialization pulse ΦINT is supplied to one input terminal of each of the OR gates OR1 and OR2. A clock pulse ΦCK is supplied to the other input terminal of the OR gate OR1, and a signal obtained upon inverting the clock pulse ΦCK by the inverter INV2 is supplied to the other input terminal of the OR gate OR2. The output terminal of the OR gate OR1 is connected to the internal clock signal line CN2 and also connected to the internal clock signal line CP2 through the inverter INV4. The output terminal of the OR gate OR2 is connected to the internal clock signal line CN1 and also connected the internal clock signal line CP1 through the inverter INV3.

In the dynamic shift register having the above arrangement, when the initialization pulse ΦINT is at low (L) level, a clock pulse ΦCK is generated at the output terminal of the OR gate OR1, and a clock pulse obtained upon inverting the clock pulse ΦCK is supplied to the output terminal of the OR gate OR2. Therefore, when the clock pulse ΦCK is at high (H) level, the internal clock signal line CN2 goes to H level, the internal clock signal line CP2 goes to L level, and the transistors P3, P7, . . . , and N3, N7, . . . are turned on. To the contrary, when the clock signal ΦCK is at L level, the output from the OR gate OR2 goes to H level, and the transistors P1, P5, . . . , and N1, N5, . . . are turned on. Therefore, the first, inverter and the second inverter at each circuit stage are alternately activated by the clock signal ΦCK, and the start pulse ΦST is sequentially shifted to the subsequent circuit stages.

When the initialization pulse ΦINT is set at H level, outputs from the OR gates OR1 and OR2 go to H level independently of the level of the clock pulse ΦCK. Therefore, both the internal clock signal lines CN1 and CN2 go to H level, and both the internal clock signal lines CP1 and CP2 go to L level. For this reason, the control transistors P1, P3, P5, P7, . . . , and N1, N3, N5, N7, . . . of all clocked inverters are simultaneously turned on. That is, all the clocked inverters are simultaneously activated.

With this operation, the input signal ΦST is inverted by each inverter and transferred to the subsequent circuit stages at a high speed independently of the clock pulse ΦCK. When the start pulse ΦST is set at L level, outputs S1, S2, . . . from all circuit stages also go to L level. When the start pulse ΦST is set at H level, the outputs S1, S2, . . . from all circuit, stages go to H level. More specifically, outputs from all circuit stages or from desired circuit stages can be almost instantaneously reset or preset. Since all the circuits are in an active state, the reset or preset state can be stably maintained for a long time. The delay time of a clocked inverter used in a normal solid-state image pickup device is normally several ns or less. Even if 1,000 clocked inverters are arranged, data can be transferred from the input stage to the last stage in several μs or less. Therefore, the circuit stages can be almost instantaneously reset or preset.

Figure 4:
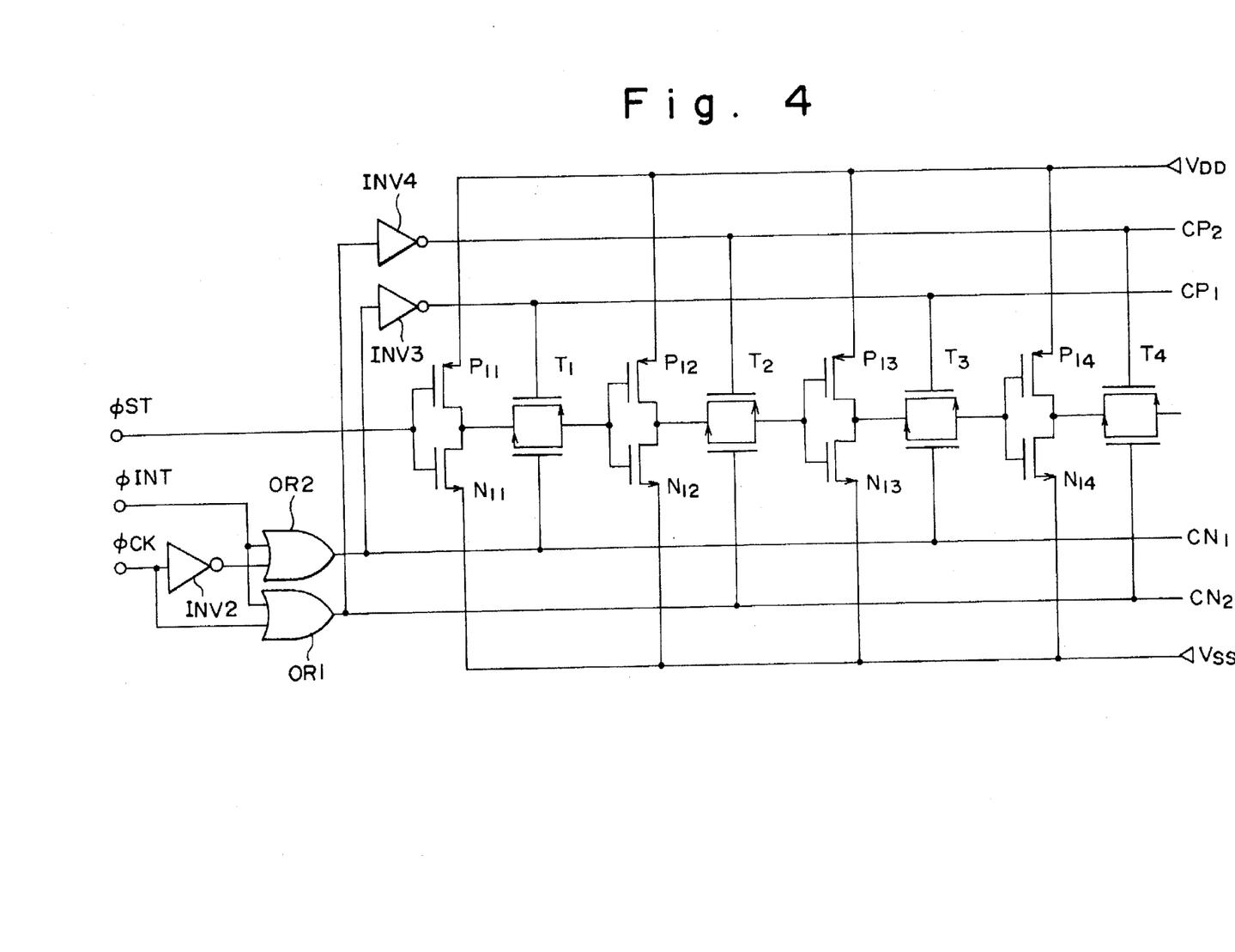
FIG. 4 is a circuit diagram showing another arrangement of the shift register used in the scanning circuit of the solid-state image pickup element according to the present invention.

FIG. 4 is a circuit diagram showing another arrangement of the dynamic shift register used in the solid-state image pickup device of the present invention. The dynamic shift register shown in FIG. 4 has two CMOS inverters at each circuit stage. More specifically, the first circuit stage has a first CMOS inverter consisting of a PMOS transistor P11 and an NMOS transistor N11, and a second CMOS inverter consisting of a PMOS transistor P12 and an NMOS transistor N12. The second circuit stage has a first CMOS inverter consisting of a PMOS transistor P13 and an NMOS transistor N13, and a second CMOS inverter consisting of a PMOS transistor P14 and an NMOS transistor N14, and this applies to the subsequent circuit stages. The inverters are connected in tandem through transfer gates. More specifically, the output terminal of the inverter consisting of the transistors P11 and N11 is connected to the input terminal of the inverter consisting of the transistors P12 and N12 through a first transfer gate T1. The output terminal of the inverter consisting of the transistors P12 and N12 is connected to the input terminal of the inverter consisting of the transistors P13 and N13 through a second transfer gate T2. The output terminal of the inverter consisting of the transistors P13 and N13 is connected to the input terminal of the inverter consisting of the transistors P14 and N14 through a third transfer gate T3, and this applies to the subsequent circuit stages.

The PMOS transistor side gates of the transfer gates T1, T3, . . . are connected to the internal clock signal line CP1, and the NMOS transistor side gates of these gates are connected to the internal clock signal line CN1. The PMOS transistor side gates of the transfer gates T2, T4, . . . are connected to the internal clock signal line CP2, and the NMOS transistor side gates of these gates are connected to the internal clock signal line CN2.

The dynamic shift register shown in FIG. 4 has a simultaneous activating circuit consisting of the inverter INV2 and the OR gates OR1 and OR2, as in FIG. 3, and also has the inverters INV3 and INV4 for inverting outputs from the OR gates OR1 and OR2 and supplying these outputs to the internal clock signal lines CP1 and CP2. The output terminals of the OR gates OR1 and OR2 are connected to the internal clock signal lines CN2 and CN1, respectively.

In the dynamic shift register shown in FIG. 4, when the initialization pulse ΦINT is at L level, the clock pulse ΦCK and an inverted clock pulse obtained upon inverting the clock pulse ΦCK are output from the OR gates OR1 and OR2, respectively. The clock pulse ΦCK and the inverted clock pulse are supplied to the internal clock signal lines CN2 and CN1, respectively. The clock pulse ΦCK and the inverted clock pulse output from the OR gates OR1 and OR2 are inverted by the inverters INV4 and INV3 and supplied to the internal clock signal lines CP2 and CP1, respectively. More specifically, a clock pulse obtained upon inverting the clock signal ΦCK is supplied to the internal clock signal line CP2, and the clock pulse ΦCK is supplied to the internal clock signal line CP1.

When the clock pulse ΦCK is at H level, the transfer gates T2, T4, . . . are turned on. When the clock pulse ΦCK is at L level, the transfer gates T1, T3, . . . are turned on. More specifically, the transfer gates T1, T2, T3, T4, . . . are alternately turned on by the clock signal ΦCK. With this arrangement, the start pulse ΦST is sequentially transferred to the subsequent circuit stages to perform a shift operation.

To the contrary, when the initialization pulse ΦINT is at H level, outputs from the OR gates OR1 and OR2 go to H level independently of the level of the clock pulse ΦCK. For this reason, the internal clock signal lines CN1 and CN2 go to H level, and the internal clock signal lines CP1 and CP2 go to L level, so all the transfer gates T1, T2, T3, T4, . . . are turned on. That is, the inverters at all circuit stages are directly connected in tandem. Therefore, the start pulse ΦST is sequentially inverted and directly transferred by the inverters. In the circuit shown in FIG. 4 as well, the circuit stages can be instantaneously reset or preset.

Two dynamic shift registers have been described above. However, as a matter of course, the present invention can be applied to dynamic shift registers of various types. More specifically, the present invention can be applied to a dynamic shift register in which each circuit stage is constituted by a set of two stages of dynamic inverters, and when one of them is substantially in the active state, the other is substantially set in the inactive state, and the input signal is sequentially transferred to the subsequent circuit stages. In this case, the sets each consisting of two stages of dynamic inverters are simultaneously activated, and the input signal is directly transferred to a plurality of subsequent circuit stages, thereby forcibly instantaneously performing reset or preset.

In the above embodiment, an inverted pulse is generated in the circuit from the input clock pulse ΦCK. However, the present invention can also be applied to a shift register or an image pickup device to which the clock pulse ΦCK and the inverted clock pulse are externally supplied. In this case, the lines for the externally input clock pulse ΦCK and the inverted pulse must set at the same predetermined level, and the first and second inverters must be simultaneously activated. Therefore, in this case, the simultaneous activating circuit in the above embodiment is externally arranged, and the same function can be obtained without modifying the shift register or circuits in the solid-state image pickup device.

To only stably maintain the operation of the dynamic shift register, the pseudo operation need not be performed except when a video signal is to be read out, and the shift register need only be set in a forced reset state by the initialization pulse ΦINT and the start pulse ΦST. For signal processing, it is preferable to perform the pseudo operation to stably maintain the operation of the peripheral circuits of the camera and generate a pseudo video signal from the solid-state image pickup device. On the other hand, to decrease power consumption, the shift register is preferably set in the reset state except when a signal is to be read out. Therefore, either operation can be selected in accordance with the application or purpose of the solid-state image pickup device.

Figure 5:
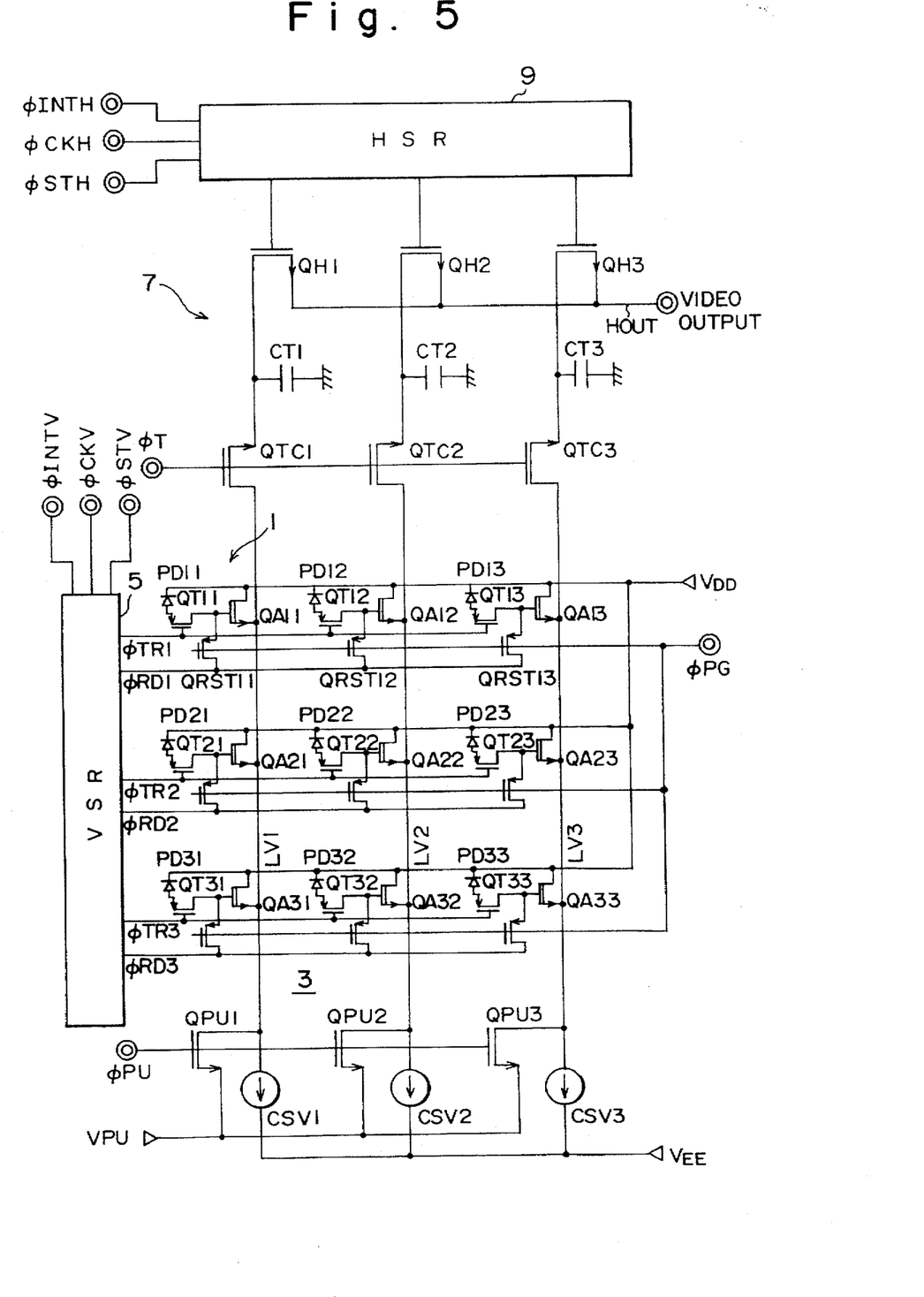
FIG. 5 is a circuit diagram of a solid-state image pickup element according to the second embodiment of the present invention.

FIG. 5 is a circuit diagram showing the circuit arrangement of a solid-state image pickup device according to another embodiment of the present invention. The same reference numerals as in FIG. 1 denote the same parts in FIG. 5. In the solid-state image pickup device shown in FIG. 5, column lines LV1 to LV3 are connected to a predetermined bias voltage VPU through switching elements QPU1 to QPU3, respectively, which are constituted by pull-up MOS transistors or the like. The gates of the switching elements QPU1 to QPU3 are commonly connected such that a predetermined control signal ΦPU can be supplied. The bias voltage VPU is a voltage for cutting off an amplification element QA even when the gate of this element QA is at a read voltage VGH of the element QA. The remaining parts are the same as those of the circuit shown in FIG. 2, and the same reference numerals denote the same parts.

When pixels are to be reset in the solid-state image pickup device in FIG. 5, all stages of a vertical scanning circuit 5 are preset, and first vertical scanning signals ΦTR1 to ΦTR3 are supplied to transfer switches QT of all pixels to turn on these transfer switches QT, as in FIG. 2. In addition, a control signal ΦPG is supplied to turn on reset switches QRST of all pixels. At this time, the voltage of second vertical scanning signals ΦRD1 to ΦRD3 is the read voltage VGH of the amplification elements of the pixel portions.

Furthermore, the pull-up switching elements QPU of the lines are turned on by the control signal ΦPU to bias the column lines LV1 to LV3 to the bias voltage VPU. As described above, the bias voltage VPU is a voltage for cutting off the amplification element QA even when the gate of this amplification element QA is at the read voltage VGH. With this arrangement, while the amplification elements QA are cut off, the residual charges of photodiodes PD are extracted through the transfer elements QT and the reset elements QRST, thereby resetting the pixels. In this case, the photodiodes PD are reset in a state wherein the are reversely biased to the read voltage VGH of the amplification elements QA. However, the source voltage of each amplification element QA is set at the bias voltage VPU by the pull-up switching element QPU, so no current flows through the amplification element QA. That is, an excess inrush current upon reset can be prevented. To read out a signal, the same operation as that of the solid-state image pickup device in FIG. 2 is performed while the pull-up switching elements QPU are cut off.

In the solid-state image pickup device in FIG. 2 or 5, the light-receiving element of each pixel preferably has characteristics for achieving complete depletion upon reset. However, when the manufacturing conditions are set to form such a light-receiving element, the JFET constituting the amplification element QA sometimes has unsatisfactory characteristics. To the contrary, when the JFET obtains satisfactory characteristics, the light-receiving element cannot be completely depleted in some cases. Therefore, when both the photodiode of the light-receiving element and the JFET of the amplification element can obtain desired characteristics, the arrangement shown in FIG. 2 is preferably used. When either element can hardly obtain or cannot have desired characteristics, the arrangement in FIG. 5 is preferably used.

In the solid-state image pickup device shown in FIG. 2 or 5, an excellent result can be obtained by setting the voltages of power supplies and signals as follows. The power supply voltages VDD is set at 5 V, the power supply voltage VEE is set at 0 V, and the read voltage VGH for turning on the amplification element QA of each pixel and activating the pixel is set at −1 V. In the arrangement shown in FIG. 2, a voltage VGL of the second vertical scanning signal ΦRD supplied to the drain of the reset element of each pixel upon reset can be set at, e.g., −3 V. In the arrangement shown in FIG. 5, the bias voltage VPU for cutting off each pixel is set at, e.g., +1 V or more to cut off the amplification element even when the gate voltage of the amplification element QA is VGH=−1 V. In this manner, a bias voltage for cutting off the amplification elements upon reset of pixels can be applied to the amplification elements by a bias voltage application means. Therefore, the characteristics of the light-receiving element and those of the amplification element can be independently optimally set. Complete depletion of the light-receiving element can be achieved while the amplification element is completely cut off. Thus, the degree of freedom in design of each element can be increased, and a high-quality solid-state image pickup device can be realized.

As has been described above, according to the present invention, in a solid-state image pickup device, reset of light-receiving elements is performed while cutting off the amplification element of each pixel. With this arrangement, even when all pixels are to be simultaneously reset in a solid-state image pickup device including a large number of pixels, an excess inrush current can be prevented. Therefore, the reliability of the solid-state image pickup device can be prevented from being degraded due to the inrush current. At the same time, the solid-state image pickup device can be prevented from being adversely affected by variations in voltage of each portion in the chip due to the inrush current, and the solid-state image pickup device can exhibit its original performance. When such a solid-state image pickup device is used for an electronic still camera which needs simultaneous reset of all pixels in pressing the shutter, an excellent result can be obtained.

In addition, according to the present invention, the dynamic shift register can be instantaneously reset or preset with a simple circuit arrangement. Furthermore, circuit stages constituting the dynamic shift register can have the same arrangement as that of the prior art, so the number of transistors of each circuit stage does not increase. For this reason, an increase in arrangement pitch between the circuit stages can be prevented.

In the solid-state image pickup device using the dynamic shift register, pixels can be instantaneously forcibly reset at an arbitrary desired time. Even while the shift register is performing a pseudo operation, a photographing operation can be immediately started as needed. In addition, a very simple gate circuit can be added to the clock input portion of the scanning circuit of the conventional solid-state image pickup device. Each circuit stage of the multistage shift register which occupies a large portion of the area of the scanning circuit need not be modified. Therefore, the influence on the chip size can be almost negligible.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 334224/1994 filed on Dec. 16, 1994, No. 60034/1995 filed on Feb. 24, 1995 and No. 221048/1995 filed on Aug. 7, 1995 are hereby incorporated by reference.

What is claimed is:

1. A solid-state image pickup device comprising:
   a plurality of pixels each having a light-receiving element for performing photoelectric conversion and accumulating a signal charge according to at least an optical signal, and an amplification element for amplifying the signal charge accumulated in said light-receiving element; and
   a scanning circuit which sequentially selects and reads out said plurality of pixels and has a shift resister constituted by connecting a plurality of circuit stages in tandem and capable of substantially simultaneously setting outputs from said plurality of circuit stages in a predetermined logical state upon reception of a predetermined control signal,
   wherein the outputs from said plurality of circuit stages in said shift register of said scanning circuit are set in the predetermined logical state to select said plurality of pixels, and the charges in said light-receiving elements are reset while cutting off the amplification elements of said plurality of pixels selected, thereby decreasing an inrush current upon reset.

2. A device according to claim 1, wherein each of said pixels comprises a transfer element for transferring the signal charge accumulated in said light-receiving element to a control electrode of said amplification element, and a reset element for resetting the charge in said control electrode of said amplification element,
wherein said transfer element and said reset element are turned on to reset the charge in said light-receiving element.

3. A device according to claim 2, further comprising bias voltage application means for applying a bias voltage to said amplification element and holding a cut-off state of said amplification element when said transfer element and said reset element are turned on to reset the charge in said light-receiving element.

4. A solid-state image pickup device comprising:
   a plurality of pixels each having a light-receiving element which consists of amplification photoelectric conversion means, two-dimensionally arranged in row and column directions, for accumulating and amplifying a signal charge according to an optical signal, and accumulates the signal charge according to the optical signal, an amplification element for amplifying the signal charge accumulated in said light-receiving element, a transfer element for transferring the signal charge accumulated in said light-receiving element to a control electrode of said amplification element, and a reset element for resetting the charge in said control electrode of said amplification element;
   a constant current circuit arranged in units of column lines which commonly connect output terminals of said pixels aligned in the column direction;
   a horizontal scanning circuit for selectively driving said plurality of pixels; and
   a vertical scanning circuit which selectively drives said plurality of pixels and has a shift register constituted by connecting a plurality of circuit stages in tandem and capable of substantially simultaneously setting outputs from said plurality of circuit stages in a predetermined logical state upon reception of a predetermined control signal,
   wherein control electrodes of said transfer elements of said pixels of each row are commonly connected to a corresponding row line, said row line is connected to a corresponding circuit stage of said vertical scanning circuit, and control electrodes of said reset elements of all of said pixels are commonly connected to a reset control signal input terminal,
   all of said transfer elements are turned on through said row lines by setting the outputs from said plurality of circuit stages of said shift register of said vertical scanning circuit in the predetermined logical state, and said reset elements of all of said pixels are turned on by supplying a reset control signal to said reset elements of all of said pixels, thereby resetting the charges in said light-receiving elements through said transfer elements and said reset elements, and
   a voltage for cutting off said amplification element is applied to said control electrode of said amplification element through said reset element which is turned on upon reset to decrease an inrush current upon reset.

5. A solid-state image pickup device comprising:
   a plurality of pixels each having a light-receiving element which consists of amplification photoelectric conversion means, two-dimensionally arranged in row and column directions, for accumulating and amplifying a signal charge according to an optical signal, and accumulates the signal charge according to the optical signal, an amplification element for amplifying the signal charge accumulated in said light-receiving element, a transfer element for transferring the signal charge accumulated in said light-receiving element to a control electrode of said amplification element, and a reset element for resetting the charge in said control electrode of said amplification element;

a constant current circuit arranged in units of column lines which commonly connect output terminals of said pixels aligned in the column direction;

a horizontal scanning circuit for selectively driving said plurality of pixels; and a vertical scanning circuit which selectively drives said plurality of pixels and has a shift register constituted by connecting a plurality of circuit stages in tandem and capable of substantially simultaneously setting outputs from said plurality of circuit stages in a predetermined logical state upon reception of a predetermined control signal, wherein control electrodes of said transfer elements of said pixels of each row are commonly connected to a corresponding row line, said row line is connected to a corresponding circuit stage of said vertical scanning circuit, control electrodes of said reset elements of all of said pixels are commonly connected to a reset control signal input terminal, and each column line has means for applying a bias voltage to said amplification element through said column line to cut off said amplification elements of said pixels connected to said column line, all of said transfer elements are turned on through said row lines by setting the outputs from said plurality of circuit stages of said shift register of said vertical scanning circuit in the predetermined logical state, and said reset elements of all of said pixels are turned on by supplying a reset control signal to said reset elements of all of said pixels, thereby resetting the charges in said light-receiving elements through said transfer elements and said reset elements, and said amplification elements of all of said pixels are cut off by said bias voltage application means upon reset to decrease an inrush current upon reset.

6. A solid-state image pickup device comprising:

a plurality of pixels each having a light-receiving element for performing photoelectric conversion and accumulating a signal charge according to at least an optical signal, and an amplification element for amplifying the signal charge accumulated in said light-receiving element;

a scanning circuit which sequentially selects and reads out said plurality of pixels and consists of a dynamic shift register, said dynamic shift register being constituted by connecting in tandem a plurality of circuit stages each of which is formed of tandem-connected first and second inverters; and a simultaneous activating circuit for alternately activating said first and second inverters of each of said circuit stages by a clock signal to sequentially transfer an input signal to subsequent circuit stages and simultaneously activating said first and second inverters to directly transfer the input signal through said plurality of circuit stages.

7. A solid-state image pickup device comprising:

a plurality of pixels each having a light-receiving element for performing photoelectric conversion and accumulating a signal charge according to at least an optical signal, and an amplification element for amplifying the signal charge accumulated in said light-receiving element;

a scanning circuit which sequentially selects and reads out said plurality of pixels and consists of a dynamic shift register, said dynamic shift register being constituted by connecting in tandem a plurality of circuit stages each of which has first and second inverters such that an output from said first inverter is input to said second inverter through a first transfer gate, and an output from said second inverter is output through a second transfer gate; and a simultaneous activating circuit for alternately activating said first and second transfer gates of each of said circuit stages by a clock signal to sequentially transfer an input signal to subsequent circuit stages and simultaneously activating said first and second transfer gates to directly transfer the input signal through said plurality of circuit stages.

* * * * *